United States Patent
Li et al.

(10) Patent No.: US 9,224,696 B2
(45) Date of Patent: Dec. 29, 2015

(54) INTEGRATED SEMICONDUCTOR DEVICE AND METHOD FOR FABRICATING THE SAME

(71) Applicant: UNITED MICROELECTRONICS CORPORATION, Hsinchu (TW)

(72) Inventors: Shih-Wei Li, Taoyuan County (TW); Yun-Han Chu, Hsinchu (TW); Guo-Chih Wei, Taichung (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 100 days.

(21) Appl. No.: 14/095,980

(22) Filed: Dec. 3, 2013

(65) Prior Publication Data

US 2015/0155242 A1 Jun. 4, 2015

(51) Int. Cl.
*H01L 23/00* (2006.01)
*H01L 23/14* (2006.01)
*H01L 21/02* (2006.01)

(52) U.S. Cl.
CPC .......... *H01L 23/562* (2013.01); *H01L 21/0217* (2013.01); *H01L 21/02164* (2013.01); *H01L 23/147* (2013.01); *H01L 2224/83* (2013.01); *H01L 2924/0002* (2013.01)

(58) Field of Classification Search
CPC ...... H01L 21/28273; H01L 21/3185; H01L 2224/48137; H01L 23/3107; H01L 23/5329; H01L 31/1136; H01L 2924/00
USPC .................. 257/415, 417, 418, 669
See application file for complete search history.

(56) References Cited

U.S. PATENT DOCUMENTS 6,214,702 B1 * 4/2001 Kim .............................. 438/459
2011/0175193 A1 * 7/2011 Nakagawa .................... 257/531

FOREIGN PATENT DOCUMENTS

WO 2009094558 7/2009

OTHER PUBLICATIONS

Eric Beyne, 2011Requirements, Challenges Andcurrent Status of Thin Wafer Carrier Systems for 3D TSV Thinning and Backside Processing, 3DS-IC Manufacturing—From Concept to Commercialization, Jul. 12, 2011, Conference, San Francisco Marriott Marquis Hotel.
Andrew C. Rudack, Raymond Caramto, Lessons Learned Applicable to SEMI 3D Standards, Jul. 13, 2010, SEMATECH, Inc., Website.
Dalvi-Malhotra, J.; Brand, G. J.; Zhong, X.-F. Use of silane-based primer on silicon wafers to enhance adhesion of edge-protective coatings during wet etching: application of the TALON wrap process. In: MOEMS-MEMS 2007 Micro and Nanofabrication. International Society for Optics and Photonics, 2007. p. 64620B-64620B-7.

* cited by examiner

*Primary Examiner* — Kyoung Lee
*Assistant Examiner* — Joannie A Garcia
(74) *Attorney, Agent, or Firm* — Ding Yu Tan

(57) ABSTRACT

An integrated semiconductor device and method for fabricating the same are provided wherein the integrated semiconductor device comprises a substrate a first stress-inducing layer, a second stress-inducing layer and an integrated circuit layer. The first stress-inducing layer covers on the substrate. The second stress-inducing layer partially covers on the first stress-inducing layer. The integrated circuit layer is bonded over the substrate.

6 Claims, 6 Drawing Sheets

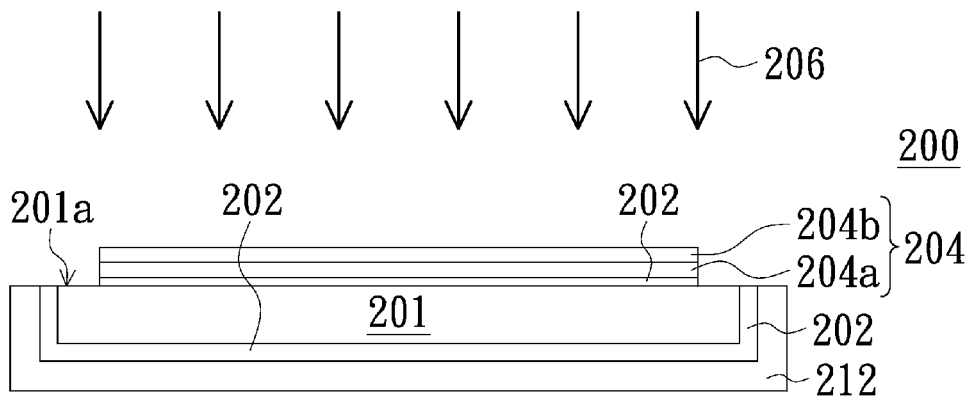
FIG. 2F
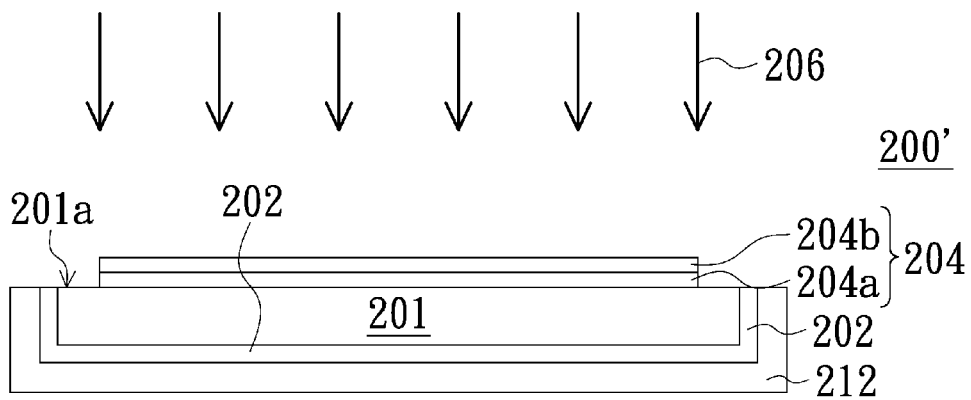
FIG. 2F'
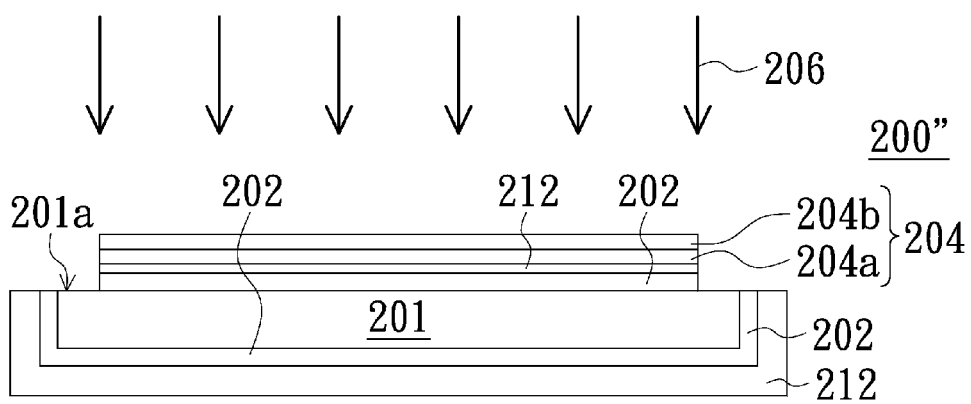
FIG. 2F"

INTEGRATED SEMICONDUCTOR DEVICE AND METHOD FOR FABRICATING THE SAME

FIELD OF THE INVENTION

The present invention relates to an integrated circuit (IC) device and a method for fabricating the same, and more particularly to an integrated semiconductor device and a method for fabricating the integrated semiconductor device.

BACKGROUND OF THE INVENTION

One goal of semiconductor manufacturing is to produce smaller integrated semiconductor devices with advantages of less power consumption and higher performance, a smaller footprint. In many applications, semiconductor wafers including integrated semiconductor devices, such as micro-electro-mechanical system (MEMS) devices, microcontrollers, microprocessors, charged-coupled devices (CCDs), solar cells, and digital micro-mirror devices (DMDs) formed thereon are made as thin as possible to reduce package height for forming the smaller integrated semiconductor devices.

To reduce substrate thickness of the device wafer, the back surface of the device wafer undergoes a thinning process, such as a back grinding or a chemical mechanical polishing (CMP). As a result, the thinned device wafer is vulnerable and susceptible to cracking and breakage during handling and manufacturing processes. To reduce the potential for damage, a carrier wafer is typically affixed to the device wafer prior to the thinning process of the device wafer in order to provide additional structural support during the subsequent handling and manufacturing processes.

Typically, the carrier wafer is affixed to the device wafer by a bonding process exerting bonding pressure on the bonded wafers. However, since the device wafers may be bowed and bent in an undesired radius ratio due to the process-induced stress, thus an unsmooth contact wave of bonding front propagating outwards from the center of the bonded wafers and moving to the edge thereof may occur. As a result, void and gases can be trapped between the bonded wafers by the bonding process, and the device wafer may be more likely damaged during the subsequent thinning process of the device wafer.

Therefore, there is a need of providing an advanced integrated semiconductor device and a method for fabricating the same to obviate the drawbacks and problems encountered from the prior art.

SUMMARY OF THE INVENTION

According to one aspect of the present invention, an integrated semiconductor device is provided, wherein the integrated semiconductor device comprises a substrate a first stress-inducing layer, a second stress-inducing layer and an integrated circuit layer. The first stress-inducing layer covers on the substrate. The second stress-inducing layer partially covers on the first stress-inducing layer. The integrated circuit layer is bonded over the substrate.

In one embodiment of the present invention, the first stress-inducing layer is a compressive stress layer, and the second stress-inducing layer is a tensile stress layer.

In one embodiment of the present invention, the first stress-inducing layer is made of silicon oxide ($SiO_2$) and the second stress-inducing layer is made of silicon nitride (SiN).

In one embodiment of the present invention, the first stress-inducing layer encapsulates the substrate and the integrated circuit layer is bonded to a portion of the first stress-inducing layer that is not covered by the second stress-inducing layer.

In one embodiment of the present invention, the substrate has a top surface, a bottom surface and at least one sidewall; the first stress-inducing layer and the second stress-inducing layer covers on the bottom surface and the at least sidewall of the substrate; and the integrated circuit layer is bonded over the top surface of the substrate.

In one embodiment of the present invention, the first stress-inducing layer further covers on the top surface of the substrate, and the integrated circuit layer is bonded on a portion of the first stress-inducing layer covering on the top surface of the substrate.

In one embodiment of the present invention, the integrated circuit layer is directly bonded on the top surface of the substrate.

According to another aspect of the present invention, a method for fabricating an integrated semiconductor device is provided, wherein the method comprises steps as follows: Firstly, a first substrate is provided and a first stress-inducing layer is then formed to encapsulate the first substrate. Next, a second stress-inducing layer is formed to cover on the first stress-inducing layer, and then a portion of the second stress-inducing layer is removed in order to bend the first substrate into a bow-shape. Subsequently, an integrated circuit layer is bonded onto a portion of the first substrate that is not covered by the second stress-inducing layer.

In one embodiment of the present invention, the first substrate is a silicon substrate; and the step for forming of the first stress-inducing layer comprises performing a thermal oxidation process to form a silicon oxide layer on a surface of the silicon substrate.

In one embodiment of the present invention, the step for forming of the second stress-inducing layer comprises performing a deposition process to form a silicon nitride layer covering on the silicon oxide layer.

In one embodiment of the present invention, after the step for forming the second stress-inducing layer, the first stress-inducing layer is encapsulated by the second stress-inducing layer.

In one embodiment of the present invention, the step for removing a portion of the second stress-inducing layer comprises performing an etching process to remove a portion of the second stress-inducing layer covering on the top surface of the substrate and to remain a portion of the second stress-inducing layer covering on a bottom surface and sidewalls of the substrate. In one embodiment of the present invention, the etching process is a dry etching process.

In one embodiment of the present invention, the integrated circuit layer is bonded to the portion of the first stress-inducing layer where is not covered by the second stress-inducing layer.

In one embodiment of the present invention, the step for removing a portion of the second stress-inducing layer further comprises removing an exposed portion of the first stress-inducing layer after the portion of the second stress-inducing layer is removed, so as to expose a portion of the substrate. In one embodiment of the present invention, the integrated circuit layer is bonded on the exposed portion of the substrate.

In one embodiment of the present invention, the step for bonding the integrated circuit layer onto the substrate further comprises steps as follows: a minimum point of the bow-shaped first substrate is firstly aligned to a center of the integrated circuit layer. Then a bonding pressure is exerted to the first substrate and the integrated circuit layer.

In one embodiment of the present invention, the integrated circuit layer is formed on a second substrate. In one embodiment of the present invention, the method for fabricating the integrated semiconductor device further comprises a step of removing the second substrate, after the first substrate is bonded to the integrated circuit layer.

In one embodiment of the present invention, the second substrate is a silicon substrate; and the step for removing the second substrate comprises a tetra-methyl-ammonium-hydroxide (TMAH) based etching process or a potassium hydroxide (KOH) based etching process.

In accordance with aforementioned embodiments, an integrated semiconductor device and the method for fabricating a same are provided, wherein a substrate having two stress-inducing layers with different stress covering thereon is provided, and the substrate is subsequently bonded with an integrated circuit layer. Since the substrate can be bent into a bow-shape having a predetermined radius ratio by these two stress-inducing layers, thus while the integrated circuit layer is bonded onto the substrate, a smooth contact wave of bonding front can propagate outwards from the center of the bonded substrate and moving to the edge thereof, so as to prevent void and gases from being warped between the substrate and the integrated circuit layer, that may cause damage of the integrated circuit layer during a subsequent thinning process. Accordingly, the yield of the integrated semiconductor device can be increased.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 2A through 2F illustrate cross-sectional views of a method for fabricating an integrated semiconductor device in accordance with another embodiment of the present invention;

FIGS. 2B', 2C' and 2F' are cross-sectional views partially illustrating a method for fabricating an integrated semiconductor device in accordance with yet another embodiment of the present invention; and FIGS. 2B'', 2C'' and 2F'' are cross-sectional views partially illustrating a method for fabricating an integrated semiconductor device in accordance with yet another embodiment of the present invention.

DETAILED DESCRIPTION OF PREFERRED EMBODIMENTS

A method for fabricating an integrated semiconductor device is provided to prevent an integrated circuit layer from being damaged. The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
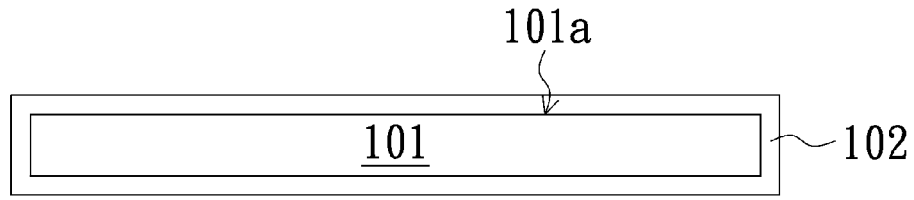
FIGS. 1A through 1F illustrate cross-sectional views of a method for fabricating an integrated semiconductor device in accordance with one embodiment of the present invention.

FIGS. 1A through 1F illustrate cross-sectional views of a method for fabricating an integrated semiconductor device 100 in accordance with one conventional method, wherein the method for fabricating the integrated semiconductor device 100 may comprises steps as follows:

Firstly, a substrate 101 is provided, and a stress-inducing layer 102 is then formed to encapsulate the substrate 101 (see FIG. 1A). In some embodiments of the present invention, the substrate 101 may be a glass substrate, a plastic substrate, a ceramic substrate or a semiconductor substrate. The stress-inducing layer 102 is a silicon oxide layer formed on the surface of the substrate 101. In the present embodiment, the substrate 101 is a silicon wafer and the stress-inducing layer 102 is a silicon oxide layer in-situ formed by a thermal oxidation process to entirely encapsulate the substrate 101. The thickness of the stress-inducing layer 102 may range from 0.1 µm to 10 µm.

Figure 1B:
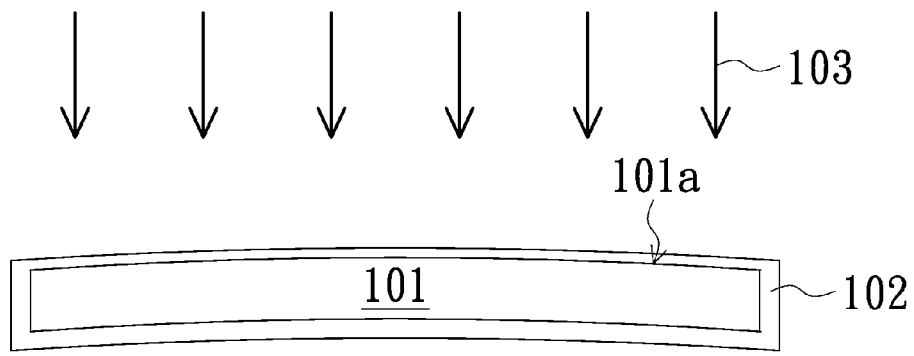
Figure 1C:
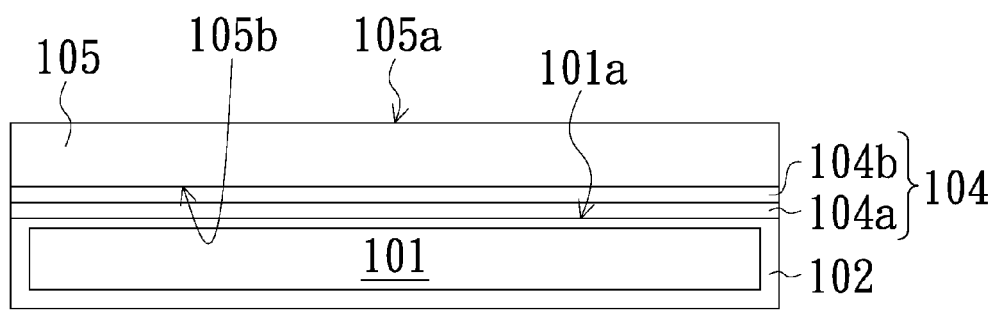
Figure 1D:
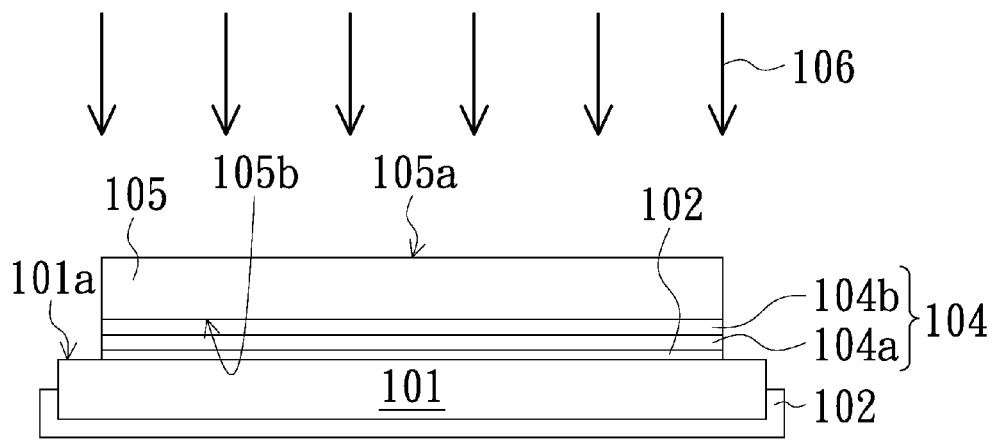
Figure 1E:
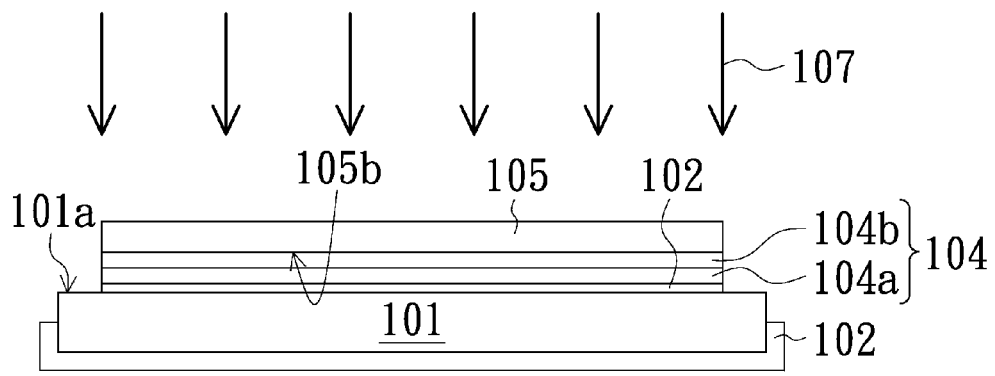
Figure 1F:
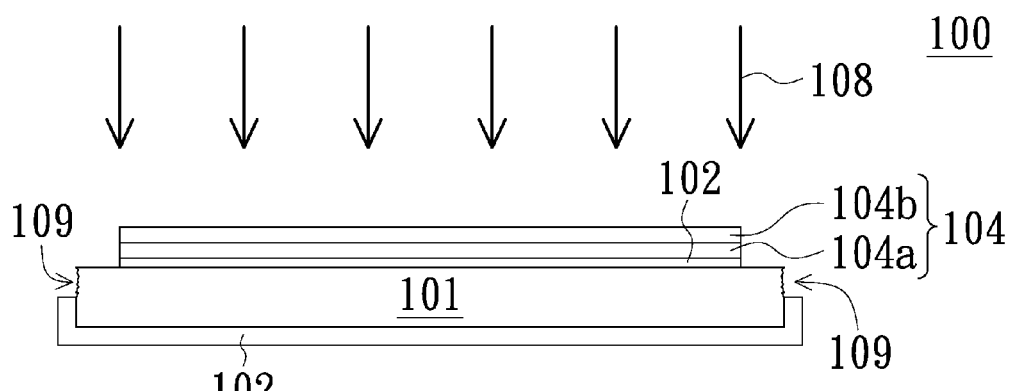

Next, a polishing process 103, such as a chemical mechanical polishing (CMP) process or an etching process is performed to remove a portion of the stress-inducing layer 102, so as to bend the substrate 101 into a bow-shape (see FIG. 1B).

In some embodiments of the present invention, a dry etching process is performed to remove a portion of the stress-inducing layer 102 covering on a top surface 101a of the substrate 101. As a result, the substrate 101 could be bent into a bow-shape by a tensile stress due to the stress imbalance of the stress-inducing layer 102 that has different thicknesses at different positions covering on different surfaces of the substrate 201. In the present embodiment, the top surface 101a of the substrate 101 that has the thinnest stress-inducing layer 102 covering thereon is bent outwards to form a convex profile for the encapsulated substrate.

Otherwise, in some other embodiments of the present invention, the polishing process 103 may thoroughly remove the portion of the stress-inducing layer 102 that covers on the top surface 101a of the substrate 101, and the exposed top surface 101a of the substrate 101 is bent outwards to form a convex. The difference between these two embodiments set forth in paragraphs [0031] and [0032] is the thickness of the portion of the stress-inducing layer 102 that covers on the top surface 101a of the substrate 101. The top surface 101a of the substrate 101 is bent towards to the same direction.

Subsequently, an integrated circuit layer 104 is provided and is then bonded onto the substrate 101. In some embodiments of the present invention, the integrated circuit layer 104 comprises a plurality of integrated semiconductor devices 104a, such as MEMS devices, microcontrollers, microprocessors, CCDs, solar cells, and DMDs, and an interconnection layer 104b formed on a front surface 105b of another substrate 105 by a front-end-of-line (FEOL) process. In the present embodiment, the substrate 105 is a silicon wafer, and the front surface 105b of the substrate 105 having the integrated circuit layer 104 formed thereon is bonded onto the top surface 101a of the substrate 101 by imposing bonding pressure on the substrates 101 and 105 (see FIG. 1C).

In some preferred embodiments of the present invention, after the integrated circuit layer 104 is bonded onto the substrate 101, an edge trim process 106 is performed to trim the edge portion of the substrate 105. In the present embodiment, the edge trim process 106 comprises a dry etching process, and a portion of the stress-inducing layer 102 that covers on the side walls of the substrate 101 may be removed (see FIG. 1D).

Thereinafter, a wafer grinding process 107 is performed on a back surface 105a (opposite to the front surface 105b) of the substrate 105 to thinning the substrate 105 (see FIG. 1E), another etching process 108 is then performed to thoroughly remove the remaining silicon substrate 105, and the integrated semiconductor device 100 is subsequently completed (see FIG. 1F) after plurality of downstream processes are carried out. In some embodiments of the present invention, the wafer grinding process 107 may be a CMP process, and the etching process 108 for removing the remaining silicon substrate 105 comprises a tetra-methyl-ammonium-hydroxide (TMAH) based etching process or a potassium hydroxide (KOH) based etching process.

Since the top surface 101a of the substrate 101 used to bond with the integrated circuit layer 104 is bent outwards, and the substrate 105 on which the integrated circuit layer 104 is formed may be also bowed and bent in an undesired radius ratio due to the process-induced stress, thus an unsmooth contact wave of bonding front propagating outwards from the center of the substrates 101 and 105 and moving to the edge thereof may occur. As a result void and gases may be more likely trapped between the two bonded substrates 101 and 105. While the grinding process 107 is carried out, the integrated circuit layer 104 may be cracked into pieces or be delaminated at the positions where the void and gases are trapped.

Moreover, since the edge trim process 106 may remove a portion of the stress-inducing layer 102 that covers on the side walls of the substrate 101, thus the exposed side walls of the substrate 101 could be damaged by the etching process 108, and a plurality of undesired bevels 109 may be formed on the edge of the substrate 101.

Figure 2A:
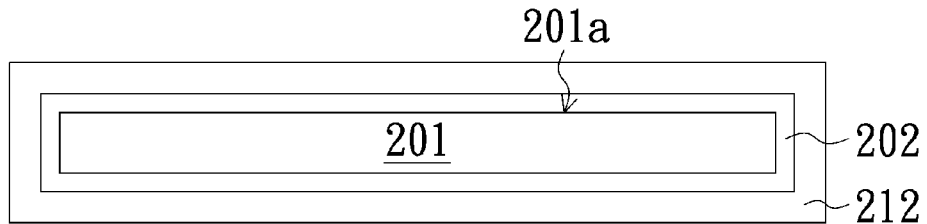

In order to provide a better integrated semiconductor device that has identical functions but not reveals the aforementioned problems found in the integrated semiconductor device 100 formed by the method depicted in the FIGS. 1A through 1F, a method for fabricating the better integrated semiconductor device according to another embodiment of present invention is provided. FIGS. 2A through 2F illustrate cross-sectional views of a method for fabricating an integrated semiconductor device 200 in accordance with one embodiment of the present invention, wherein the method comprises steps as follows:

Firstly, a substrate 201 is provided, and a first stress-inducing layer 202 is then formed to encapsulate the substrate 201 (see FIG. 2A). In some embodiments of the present invention, the substrate 201 may be a glass substrate, a plastic substrate, a ceramic substrate or a semiconductor substrate. The first stress-inducing layer 202 is a silicon oxide layer formed on the surface of the substrate 201. In the present embodiment, the substrate 201 is a 12-inch silicon wafer, and the first stress-inducing layer 202 is in-situ formed by a thermal oxidation process to entirely encapsulate the substrate 201.

A second stress-inducing layer 212 is formed on the first stress-inducing layer 202. In some embodiments of the present invention, the second stress-inducing layer 212 is a silicon nitride layer formed by a deposition process blanket over the first stress-inducing layer 202 and encapsulating the substrate 201. However, in another embodiment of the present invention, the second stress-inducing layer 212 is a silicon nitride layer partially covering on the first stress-inducing layer 202.

Figure 2B:
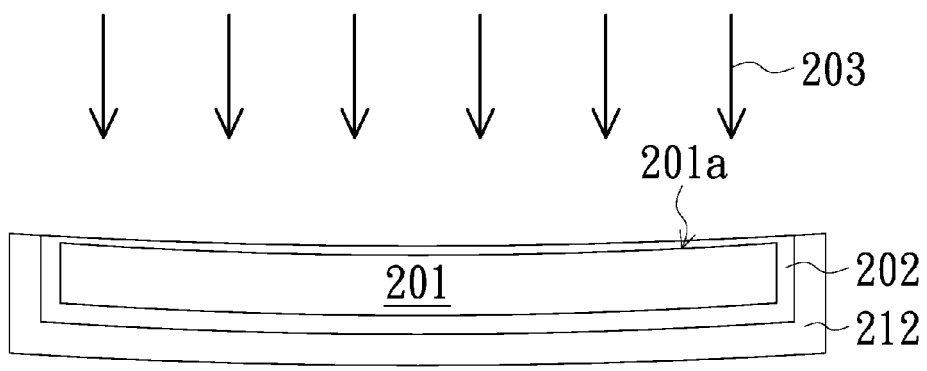
Figure 2B:
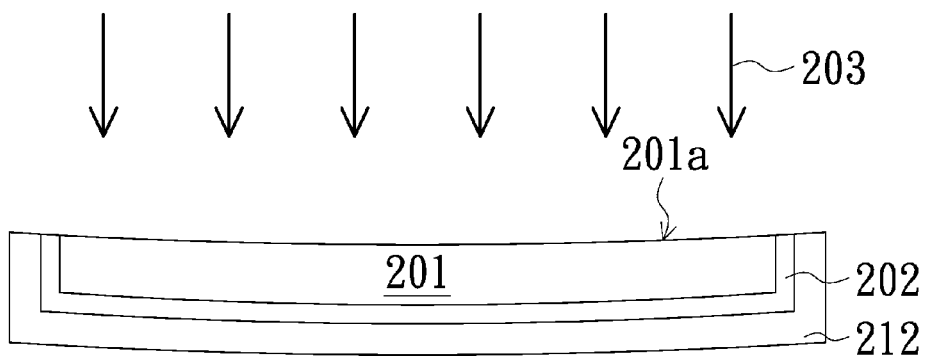

Next, a polishing process 203, such as a CMP process or an etching process, is performed to remove a portion of the first stress-inducing layer 202 and a portion of the second stress-inducing layer 212, so as to bend the substrate 201 into a bow-shape (see FIG. 2B). For example, in some embodiments of the present invention, a dry etching process is performed to remove a portion of the second stress-inducing layer 212 covering above or over the top surface 201a of the substrate 201 and to retain a portion of the second stress-inducing layer 212 that covers on a bottom surface and sidewalls of the substrate 201, so as to merely expose a portion of the first stress-inducing layer 202.

It should be appreciated that the exposed portion of the first stress-inducing layer 202 could be further etched and thinned, to a certain extent, by the polishing process 203 (the CMP process or the dry etching process). Such that, portions of the first stress-inducing layer 202 that covers on the top surface 201a of the substrate 201 has a thinner thickness than other portions of the first stress-inducing layer 202.

However, in some embodiments of the present invention, the exposed portion of the first stress-inducing layer 202 that covers on the top surface 201a of the substrate 201 may be thoroughly removed by the polishing process 203, so as to expose the top surface 201a of the substrate 201 (see FIG. 2B').

In yet other embodiments of the present invention, the portion of the second stress-inducing layer 212 covering above or over the top surface 201a of the substrate 201 is not thoroughly removed by the polishing process 203. In other words, the polished second stress-inducing layer 212 further covers on the top surface 201a of the substrate 201 (see FIG. 2B").

As discussed above, the substrate 201 could be bent into a bow-shape due to the stress imbalance of the first stress-inducing layer 202 and the second stress-inducing layer 212 respectively having different thicknesses at different positions covering on different surfaces of the substrate 201. In the present embodiment, because the second stress-inducing layer 212 covering on the first stress-inducing layer 202 can provide a compressive stress greater than the tensile stress that is provided by the first stress-inducing layer 202, the top surface 201a of the substrate 201 that has the thinnest stress-inducing layer 202 covering thereon is thus bent inwards to form a concave profile for the encapsulated substrate 201.

In the present embodiment, the radius of the bent bow-shape substrate 201 can be established by considering the counter-balancing of the tensile stress and the compressive stress respectively provided by the first stress-inducing layer 202 and the second stress-inducing layer 212. In other words, the radius of the bent bow-shape substrate 201 can be altered and adjusted by controlling the original thicknesses and the polished thicknesses of the first stress-inducing layer 202 and the second stress-inducing layer 212, nevertheless the radius of curvature of the bent bow-shaped substrate 201 is not proportion to the original thicknesses and the polished thicknesses of the first stress-inducing layer 202 and the second stress-inducing layer 212.

In some embodiments of the present invention, the thickness of either the first stress-inducing layer 202 or the second stress-inducing layer 212 may be limited to be within a predetermined thickness range. For example, the original thickness of the first stress-inducing layer 202 preferably may be about 300 Å, and the polished thickness of the portion of the first stress-inducing layer 202 covering on the top surface 201a of the substrate 201 may be thinned down by about 30 Å. The original thickness of the second stress-inducing layer 212 may be ranged from 300 Å to 100 Å, and is preferably about 650 Å.

Subsequently, an integrated circuit layer 204 is provided, and then is bonded onto the substrate 201. In some embodiments of the present invention, the integrated circuit layer 204 comprises a plurality of integrated semiconductor devices 204a, such as MEMS devices, microcontrollers, microprocessors, CCDs, solar cells, and DMDs, and an interconnection layer 204b formed on a front surface 205b of an another substrate 205 by a FEOL process.

In the present embodiment, the another substrate 205 is a silicon wafer, and the front surface 205b of the substrate 205 having the integrated circuit layer 204 formed thereon is bonded onto the portion of the first stress-inducing layer 202 that covers on the top surface 201a of the substrate 201 by imposing, applying or exerting bonding pressure on the substrates 201 and 205 (see FIG. 2C) by the steps as follows:

Firstly, a minimum point of the concave top surface 201a of the substrates 201 is aligned to a center of the integrated circuit layer 204. An exerted bonding pressure is then imposed or applied to bond the substrates 201 and 205 together.

Figure 2C:
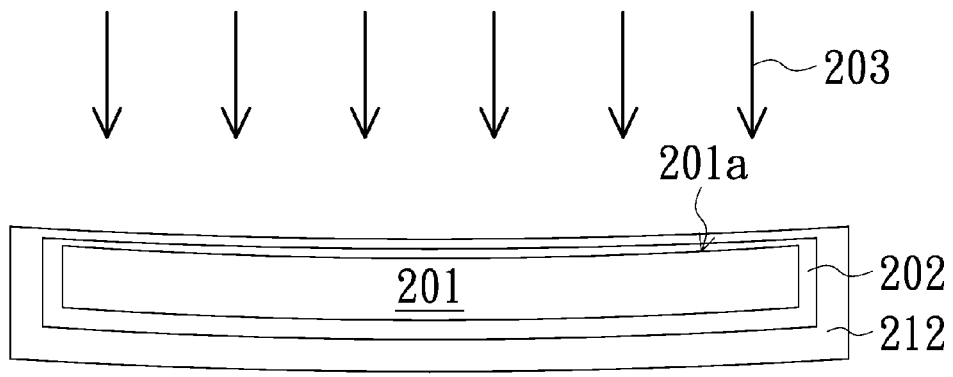
Figure 2C:
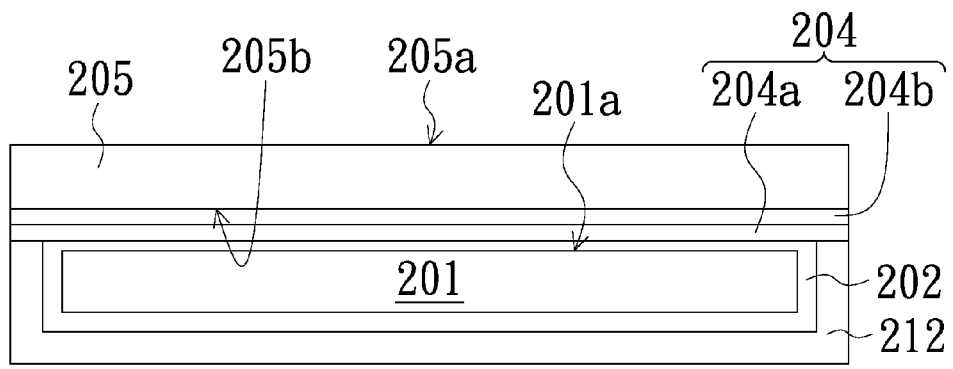
Figure 2C:
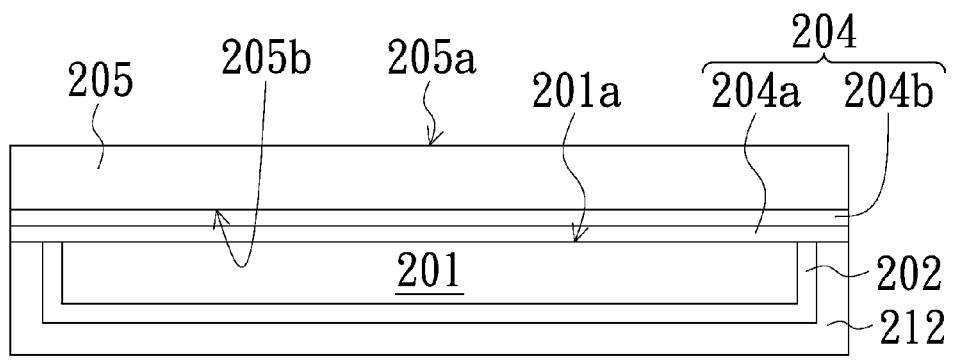

However, in the illustrated embodiment with the top surface 201a of the substrate 201 being exposed by the polishing process 203, the front surface 205b of the substrate 205 having the integrated circuit layer 204 formed thereon is directly bonded onto the exposed top surface 201a of the substrate 201 (see FIG. 2C'). Similarly, in the illustrated embodiment with the top surface 201a of the substrate 201 being covered by the polished second stress-inducing layer 212, the front surface 205b of the substrate 205 having the integrated circuit layer 204 formed thereon is directly bonded onto the polished second stress-inducing layer 212 (at the front surface 205b) (see FIG. 2C'').

Figure 2D:
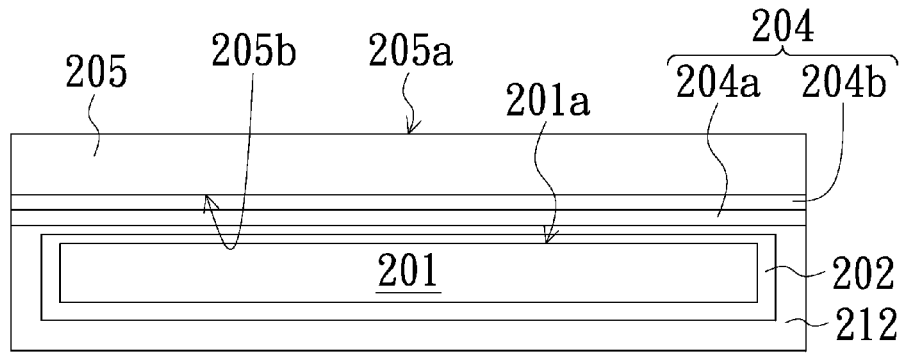
Figure 2D:
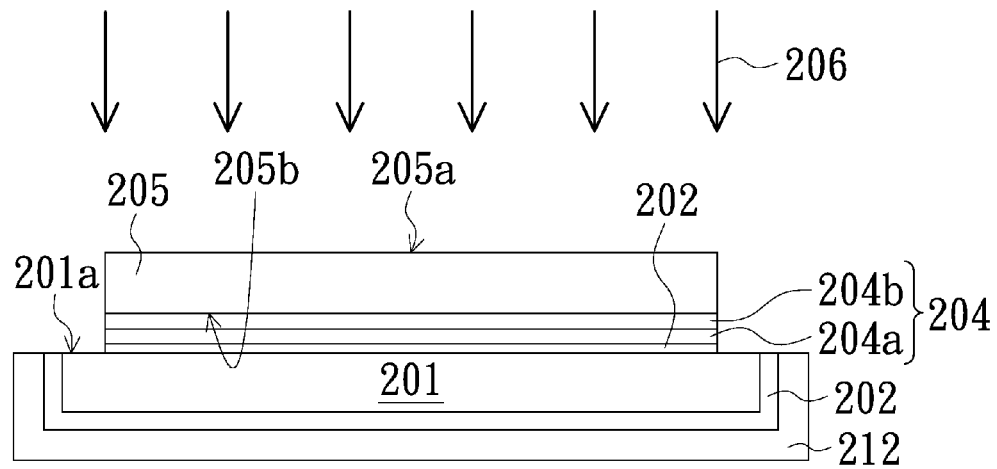
Figure 2E:
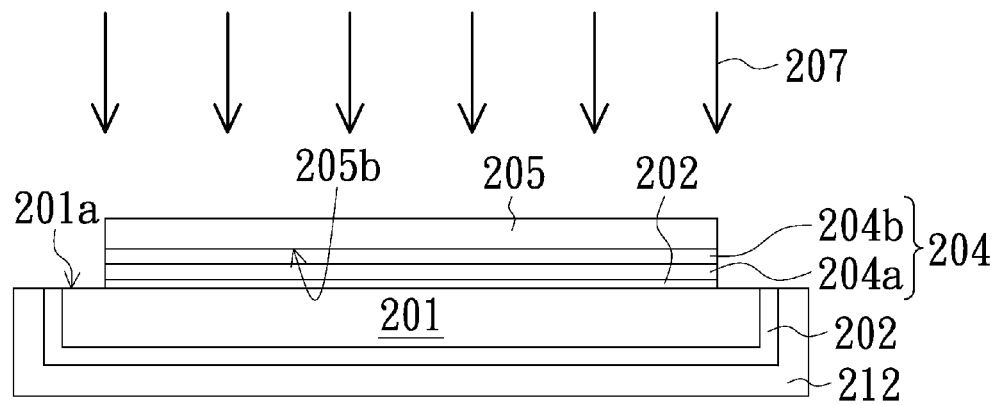

In some preferred embodiments of the present invention, after the integrated circuit layer 204 is bonded onto the substrate 201, an edge trim process 206 is performed to trim the edge portion of the substrate 205 (see FIG. 2D). In the present embodiment, the edge trim process 206 comprises a dry etching process. Since the portion of the first stress-inducing layer 202 that covers on the side walls of the substrate 201 is being covered by the second stress-inducing layer 212, thus the portion of the first stress-inducing layer 202 that covers on the side walls of the substrate 201 can be prevented from being removed.

Thereinafter, a wafer grinding process 207 is performed on a back surface 205a (opposite to the front surface 205b) of the substrate 205 to thinning down the substrate 205 (see FIG. 2E), another etching process 208 is then performed to thoroughly remove the remaining silicon substrate 205, and the integrated semiconductor device 200 is subsequently completed (see FIG. 2F) after plurality of downstream processes are carried out. Alternatively, the integrated semiconductor devices 200' and 200'' that are based on the various structures depicted in FIGS. 2C' and 2C'' are respectively formed by the same steps (see FIGS. 2F' and 2F'').

In some embodiments of the present invention, the wafer grinding process 207 may be a CMP process, and the etching process 208 for removing the remaining silicon substrate 205 comprises a TMAH based etching process or a KOH based etching process.

Since the top surface 201a of the substrate 201 used to bond with the integrated circuit layer 204 is bent inwards, thus the bonding process may obtain a smoother contact wave of bonding front propagating outwards from the center of the substrates 201 and 205, respectively, and moving to the edges thereof. As a result, void and gases may be hardly trapped between the two bonded substrates 201 and 205. Thus, the integrated circuit layer 204 may be lesser prone or subjected to cracking or delamination during the subsequent grinding process 207 and the yield of the integrated semiconductor device 200 can be increased significantly.

In accordance with aforementioned embodiments, an integrated semiconductor device and the method for fabricating a same are provided, wherein a substrate having two stress-inducing layers with different stresses covering thereon is provided, and the substrate is subsequently bonded with an integrated circuit layer. Since the substrate can be bent into a bow-shape having a predetermined radius ratio by these two stress-inducing layers, thus while the integrated circuit layer is bonded onto the substrate, a smoother contact wave of bonding front can propagate outwards from the center of the bonded substrate and moving to the edge thereof, so as to prevent void and gases from being trapped between the substrate and the integrated circuit layer, that may cause damage of the integrated circuit layer during a subsequent thinning process. Accordingly, the yield of the integrated semiconductor device can be increased.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An integrated semiconductor device, comprising:
   a substrate;
   a first stress-inducing layer covering on the substrate;
   a second stress-inducing layer partially covering on the first stress-inducing layer; and
   an integrated circuit layer bonded over the substrate,
   wherein the substrate has a to surface, a bottom surface and at least one sidewall; the first stress-inducing layer and the second stress-inducing layer cover on the bottom surface and the at least one sidewall of the substrate; and the integrated circuit layer is bonded over the to surface of the substrate.

2. The integrated semiconductor device according to claim 1, wherein the first stress-inducing layer is a compressive stress layer and the second stress-inducing layer is a tensile stress layer.

3. The integrated semiconductor device according to claim 1, wherein the first stress-inducing layer is made of silicon oxide ($SiO_2$) and the second stress-inducing layer is made of silicon nitride (SiN).

4. The integrated semiconductor device according to claim 1, wherein the first stress-inducing layer encapsulating the substrate and the integrated circuit layer is bonded to a portion of the first stress-inducing layer that is not covered by the second stress-inducing layer.

5. The integrated semiconductor device according to claim 1, wherein the second stress-inducing layer further covers on the top surface of the substrate, and the integrated circuit layer is bonded on a portion of the second stress-inducing layer covering on the top surface of the substrate.

6. The integrated semiconductor device according to claim 1, wherein the integrated circuit layer is directly bonded on the top surface of the substrate.

* * * * *